US012453021B2

United States Patent
Mendizabal Riveros (10) Patent No.: US 12,453,021 B2
(45) Date of Patent: Oct. 21, 2025

(54) WIRELESS HIGH VOLTAGE INTERLOCK SWITCH

(71) Applicant: Vitesco Technologies USA, LLC, Auburn Hills, MI (US)

(72) Inventor: Omar Mendizabal Riveros, San Pedro Tlaquepaque (MX)

(73) Assignee: Vitesco Techenologies, Auburn Hills, MI (US)

( * ) Notice: Subject to any disclaimer, the term of this patent is extended or adjusted under 35 U.S.C. 154(b) by 0 days.

(21) Appl. No.: 18/665,212

(22) Filed: May 15, 2024

(65) Prior Publication Data

US 2025/0151211 A1    May 8, 2025

Related U.S. Application Data

(60) Provisional application No. 63/547,453, filed on Nov. 6, 2023.

(51) Int. Cl.
H05K 5/02    (2006.01)
(52) U.S. Cl.
CPC .................... *H05K 5/0208* (2013.01)
(58) Field of Classification Search
CPC ................................... H05K 5/0208
See application file for complete search history.

(56) References Cited

U.S. PATENT DOCUMENTS

| | | | |
|---|---|---|---|
| 2013/0342030 A1* | 12/2013 | Meyer | G05B 9/02 307/328 |
| 2014/0102149 A1* | 4/2014 | Park | D06F 34/20 68/12.26 |
| 2016/0101202 A1* | 4/2016 | Gil | A61L 2/10 250/455.11 |
| 2021/0195770 A1* | 6/2021 | Bothor | H05K 5/06 |
| 2022/0158586 A1* | 5/2022 | Sella | H03K 17/965 |
| 2024/0148189 A1* | 5/2024 | Jost | A47J 43/085 |

* cited by examiner

*Primary Examiner* — Adi Amrany (57) ABSTRACT

An access assembly for a high voltage box or inverter which reduces the associated risk of exposure to charged components, such as high voltage power electronics, where an interlock is required. The access is limited so that the system may deactivate some functionality, and/or internal devices are discharged to allow safe access. The access assembly includes a wireless detection method using a sensor circuit paired with a magnet that detects if a cover or connector is removed. The magnet is mounted to the cover or connector. This detection may be made through walls of non-magnetic material, which avoids the incorporation of extra components such as PCBs or a pigtail harness, enables a much simpler EMC shielding by avoiding unwanted openings, and simplifies assembly by reducing required operations and processes. The access assembly may be used for applications where controlled access is required for installation or service of power electronic products.

9 Claims, 10 Drawing Sheets

WIRELESS HIGH VOLTAGE INTERLOCK SWITCH

CROSS-REFERENCE TO RELATED APPLICATIONS

This application claims the benefit of provisional application 63/547,453, filed Nov. 6, 2023. The disclosure of the above application is incorporated herein by reference.

FIELD OF THE INVENTION

The invention relates generally to an access assembly for an inverter, which allows for safe access inside the inverter once one or more of the components inside the inverter has been deactivated or discharged.

BACKGROUND OF THE INVENTION

Many high voltage applications require the need of one or more safety measures to prevent user access to high voltage components when the circuit is closed. In a non-limiting example, components inside inverters and high voltage boxes have components, such as DC link capacitors, which operate with high voltage and are charged during product function.

Current designs include a high-voltage interlock in the form of two pins and connectors which detect if the circuit is open once a connector is removed. However, this type of system incorporates the use of extra printed circuit boards (PCBs) and at least one pigtail harness, adding assembly complexity and electromagnetic compatibility (EMC) issues. Also, connection systems which require detection of an access cover also require adding mechanical switches or contacts, which is not robust due to environmental factors and degradation.

Accordingly, there exists a need for a high-voltage box which limits access to internal components to only when there is minimized risk of injury to the user.

SUMMARY OF THE INVENTION

In an embodiment, the present invention is an access assembly for a high voltage box. The access assembly reduces the associated risk of exposure to charged components. The access is limited so that the system may deactivate some functionality, and/or internal devices are discharged to allow safe access.

In an embodiment, the access assembly includes a wireless detection method using a Hall effect sensor circuit paired with a magnet that detects if a cover or connector is removed. In an embodiment, the Hall effect sensor is incorporated into one of the product PCBs, and a magnet is mounted to the cover or connector. This detection may be made through walls of non-magnetic materials such as aluminum die cast housings. This avoids the incorporation of extra components such as PCBs or a pigtail harness, enables a much simpler EMC shielding by avoiding unwanted openings, and simplifies assembly by reducing required operations and processes.

In an embodiment, the magnet may be mounted to a connector.

In one or more embodiments, the access assembly may be used for applications such as high voltage DC or AC connection points, where controlled access is required for installation or service of power electronic products. In an embodiment, the access assembly of the present invention may be used on high voltage power electronics where an interlock is required, such as inverters and high voltage boxes.

An access assembly for an inverter, having a housing of an inverter, a recess integrally formed as part of the housing, an aperture integrally formed as part of the housing in proximity to the recess, an access cover which prevents access to the inside of the housing by blocking the aperture when the access cover is attached to the housing, a magnet tower selectively disposed in the recess, a magnet connected to the magnet tower, a sensor located inside the housing, a lower wall integrally formed as part of the recess such that the magnet is detectable through the lower wall by the sensor when the magnet tower is disposed in the recess, and a printed circuit board (PCB) located inside the housing, the sensor mounted to the PCB.

In an embodiment, the magnet tower is located in the recess when the access cover is connected to the housing such that the sensor detects the presence of the magnet in the recess, and when the magnet tower is removed prior to the access cover being detached from the housing, the sensor detects when the magnet has been removed from the recess.

In an embodiment, a connecting flange is integrally formed with the magnet tower, a recess portion integrally formed as part of the connecting flange, and at least one fastener extends through the access cover and into the housing, connecting the access cover to the housing, and a portion of the fastener extends into the recess portion.

In an embodiment, at least a portion of the connecting flange overlaps with a portion of the access cover and also overlaps with the at least one fastener when the access cover and the connecting flange are connected to the housing, such that the connecting flange must be detached from the housing prior to the access cover being detached from the housing.

In an embodiment, the magnet tower having a first portion that is conically shaped, a second portion that is cylindrically shaped, at least two circumferential flanges integrally formed as part of the second portion of the magnet tower, and a seal circumscribing the second portion of the magnet tower such that the seal is disposed between the at least two circumferential flanges.

In an embodiment, the seal is in contact with an inner surface of the recess when the access cover and the connecting flange are connected to the housing.

In an embodiment, the recess includes a first section, and a second section having a diameter that is smaller than the first section. In an embodiment, the first portion of the magnet tower is located in the first section of the recess and the second portion of the magnet tower is located in the section of the recess when the access cover and the connecting flange are connected to the housing such that the seal is in contact with an inner surface of the second section.

In an embodiment, a protective cover is connected to the housing. The magnet tower is connected to the access cover such that when the access cover is attached to the housing the magnet tower is disposed in the recess, and the protective cover is positioned such that the access cover must be detached from the housing prior to the protective cover being detached from the housing.

Further areas of applicability of the present invention will become apparent from the detailed description provided hereinafter. It should be understood that the detailed description and specific examples, while indicating the preferred embodiment of the invention, are intended for purposes of illustration only and are not intended to limit the scope of the invention.

BRIEF DESCRIPTION OF THE DRAWINGS

The present invention will become more fully understood from the detailed description and the accompanying drawings, wherein.

DETAILED DESCRIPTION OF THE PREFERRED EMBODIMENTS

The following description of the preferred embodiment(s) is merely exemplary in nature and is in no way intended to limit the invention, its application, or uses.

Figure 1:
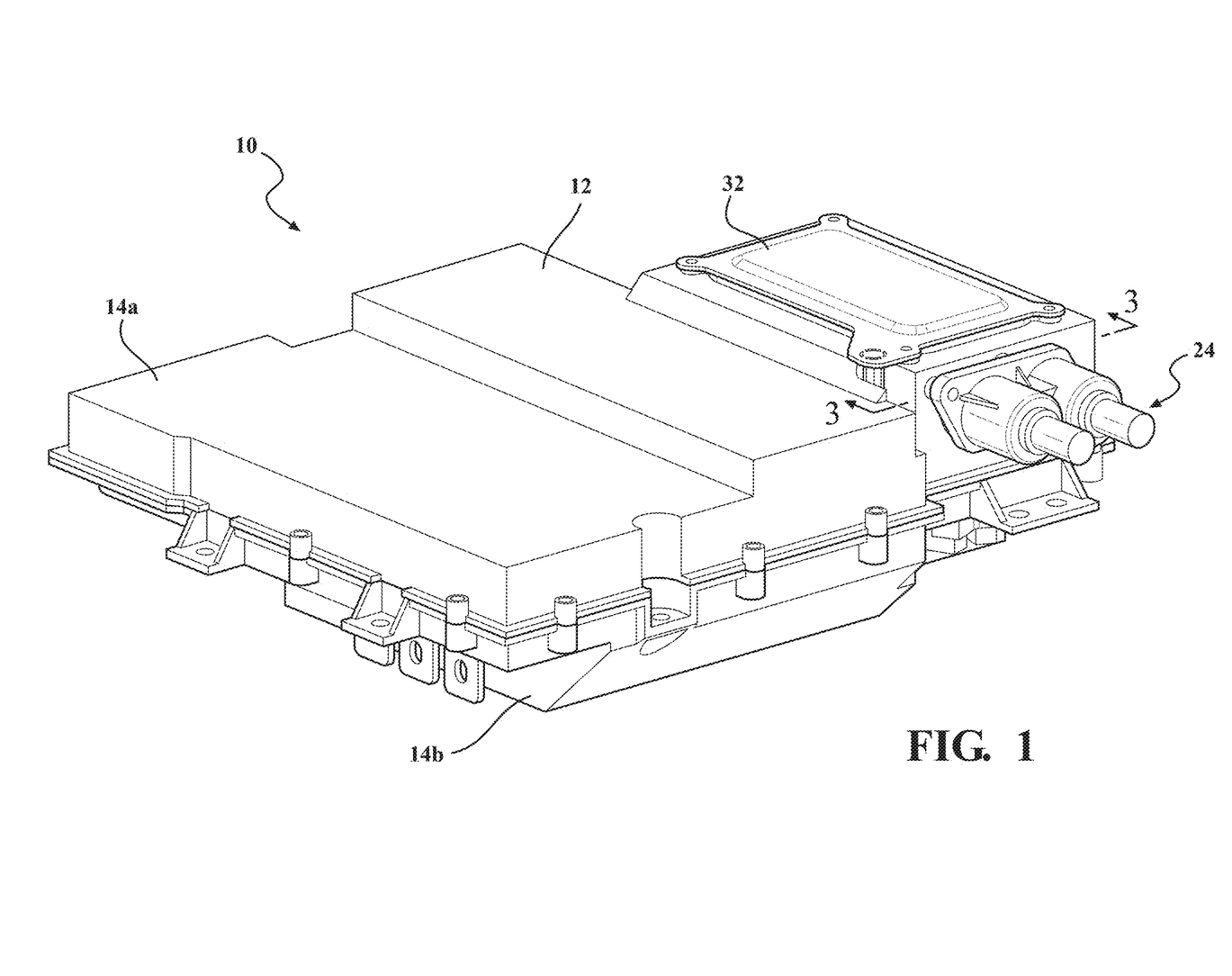
FIG. 1 is a perspective view of a high voltage inverter having an access assembly, according to embodiments of the present invention.
Figure 2:
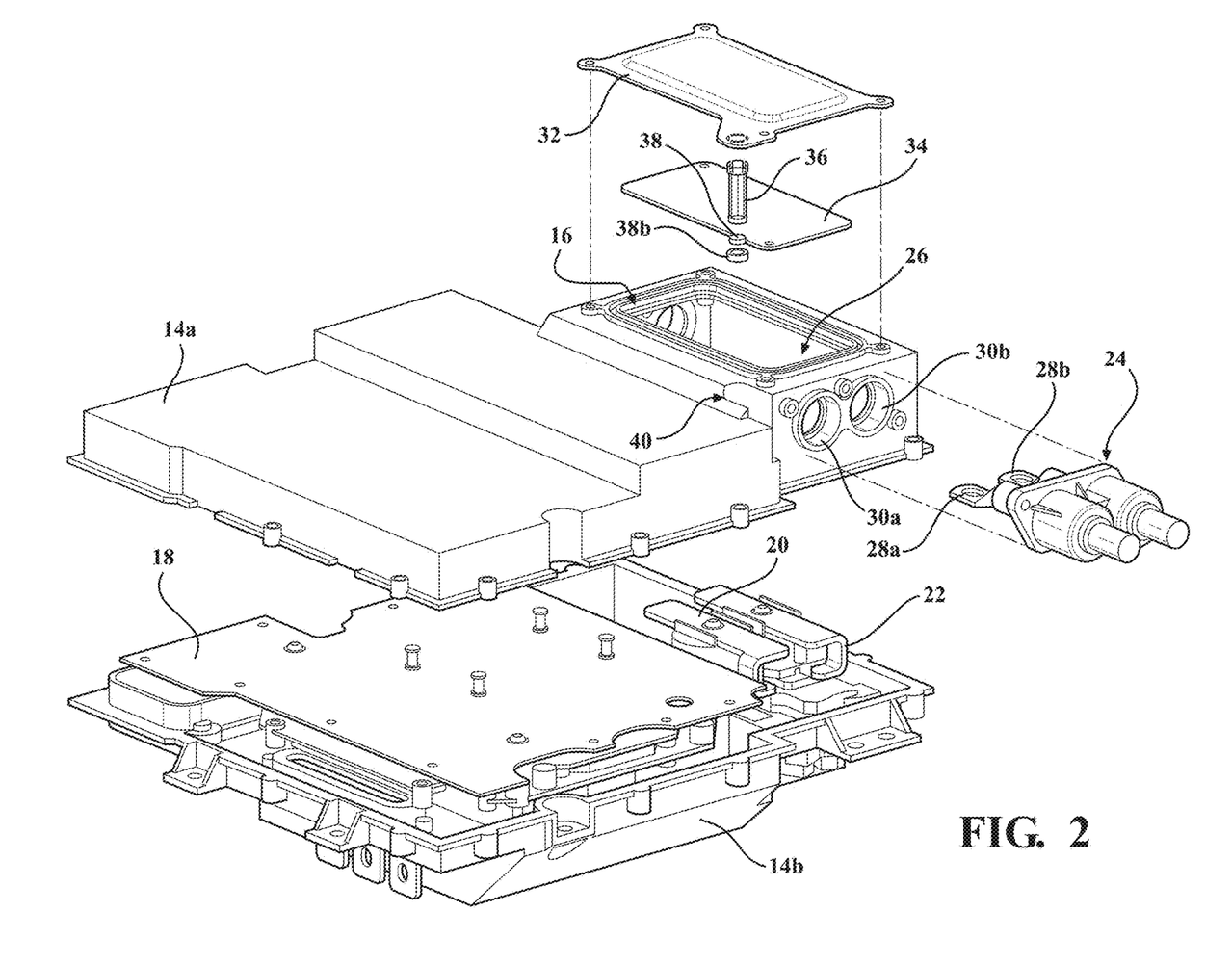
FIG. 2 is an exploded view of a high voltage inverter having an access assembly, according to embodiments of the present invention.
Figure 3:
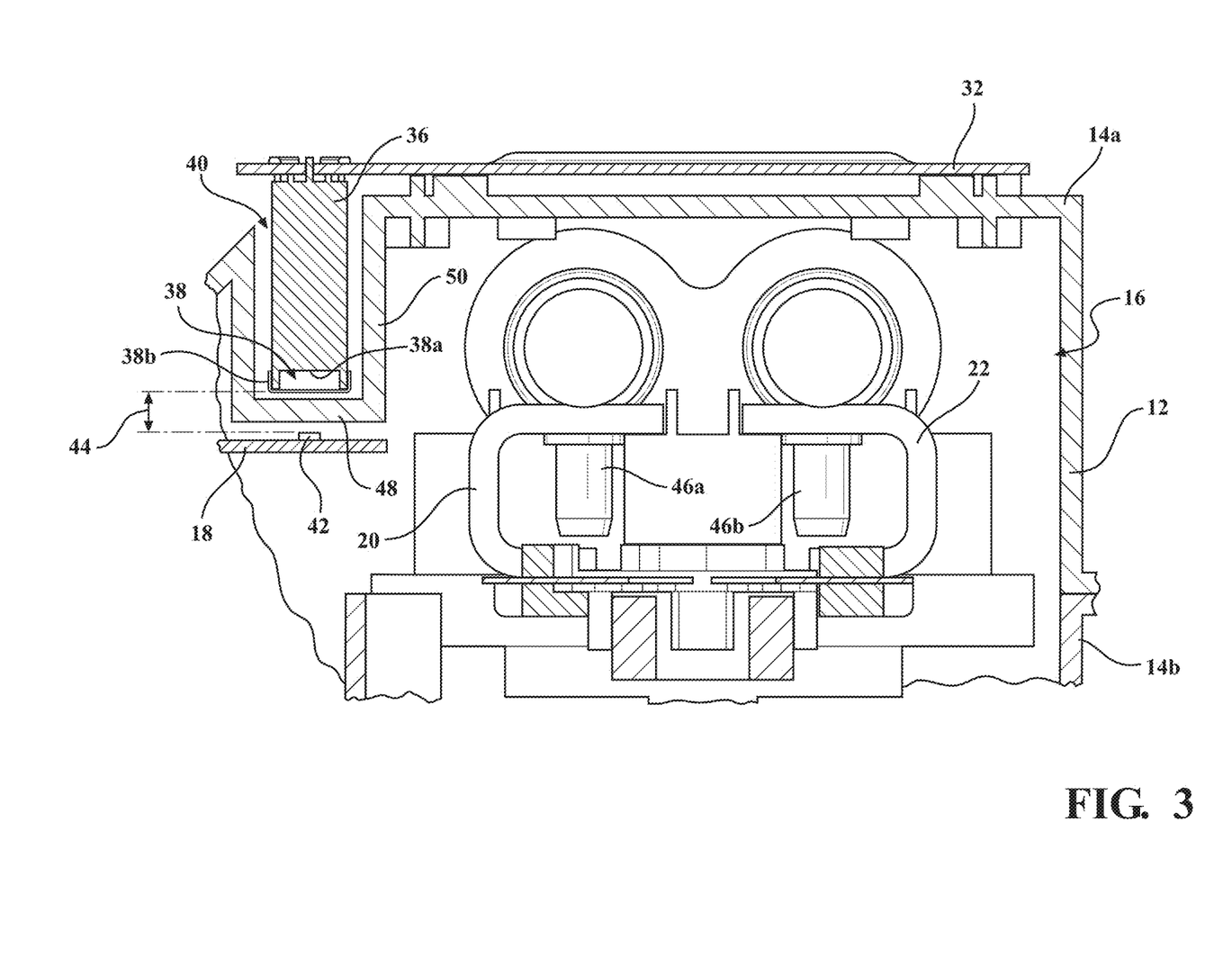
FIG. 3 is a sectional view taken along lines 3-3 of FIG. 1.

An inverter having an access assembly according to the present invention is shown in FIG. 1, generally at 10. Referring to FIGS. 1-3, the inverter includes a housing 12 having first housing portion 14a and a second housing portion 14b and disposed in a cavity 16 of the housing 12 is a printed circuit board (PCB) 18.

Also disposed in the cavity 16 and in electrical communication with the PCB 18 is a first busbar 20 and a second busbar 22. The busbars 20,22 are also connected to a DC connector, shown generally at 24.

Figure 6:
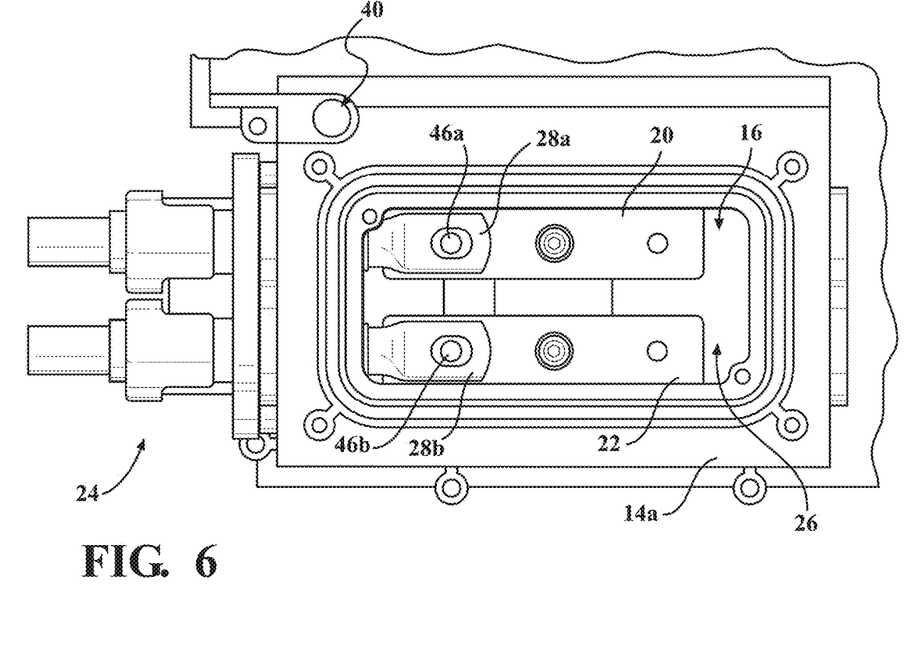
FIG. 6 is a third top view during the disassembly process of part of a high voltage inverter having an access assembly, according to embodiments of the present invention.
Figure 7:
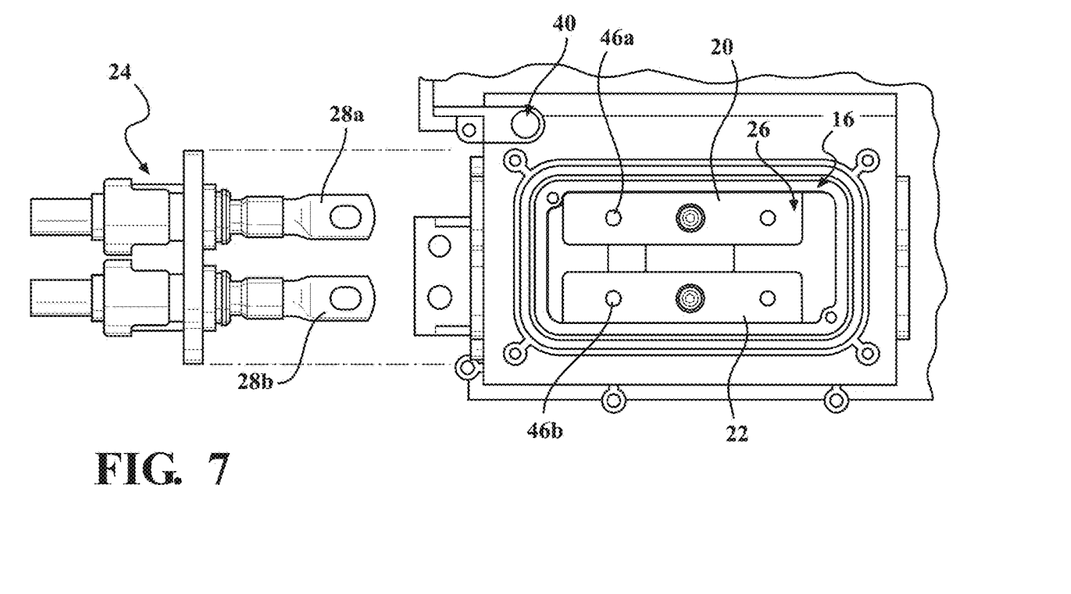
FIG. 7 is a fourth top view during the disassembly process of part of a high voltage inverter having an access assembly, according to embodiments of the present invention.

The first housing portion 14a includes an aperture, shown generally at 26, and the busbars 20,22 are located in the cavity 16 such that the busbars 20,22 may be seen when looking into the aperture 26, as shown in FIGS. 6-7. Referring to FIGS. 2 and 6-7, the DC connector 24 includes two terminals 28a,28b, and when assembled, the first terminal 28a is connected to the first busbar 20, and the second terminal 28b is connected to the second busbar 22. When first terminal 28a is connected to the first busbar 20 and the second terminal 28b is connected to the second busbar 22, the first terminal 28a extends through a first connector aperture 30a of the first housing portion 14a, and the second terminal 28b extends through a second connector aperture 30b of the first housing portion 14.

Referring again to FIGS. 1-3, to access the cavity 16 such that the terminals 28a,28b may be attached to, or detached from, the busbars 20,22, the inverter 10 includes an access assembly, which limits access to the cavity 16 by a user, such that one or more components in the cavity 16 may be discharged or deactivated prior to allowing access to the cavity 16.

The access assembly includes a first cover, or access cover 32, and a second cover, or protective cover 34. Connected to the access cover 32 is a magnet tower 36 and connected to the magnet tower 36 is a magnet 38. The magnet 38 is disposed in a recess 38a formed as part of the magnet tower 36, and when assembled, the magnet 38 is protected by a retention cover 38b, where the retention cover 38b is connected to the magnet tower 36 as shown in FIG. 3. When the access cover 32 is connected to the first housing portion 14a, the magnet tower 36 extends into a recess, shown generally at 40, integrally formed as part of the first cover portion 14a.

Mounted to the PCB 18 is a sensor, which in this embodiment is a Hall effect sensor 42. The sensor 42 is mounted to the PCB 18 such that the sensor 42 is able to detect when the magnet tower 36 is located in the recess 40 and the magnet 38 is positioned as shown in FIG. 3. More specifically, the sensor 42 is able to detect when the magnet 38 is a distance 44 from the sensor 42. The magnet 38 is located at the distance 44 from the sensor 42 when the access cover 32 is connected to the first housing portion 14a. Because the recess 40 is outside of the first housing portion 14a, the sensor 42 detects the presence of the magnet 38 through a lower wall portion 48 formed as part of the recess 40. Also formed as part of the recess 40 is a cylindrical wall portion 50, where the cylindrical wall portion 50 is integrally formed with the lower wall portion 48. The magnet tower 36 is surrounded by the cylindrical wall portion 50 when the magnet tower 36 is located in the recess 40. The recess 40 having the wall portions 48,50 separates the recess 40 from the cavity 16, such that the magnet 38 may be located at the distance 44 from the sensor 42 when the access cover 32 is connected to the first housing portion 14a, while limiting the exposure of the cavity 16 to dirt, moisture, and debris.

Figure 4:
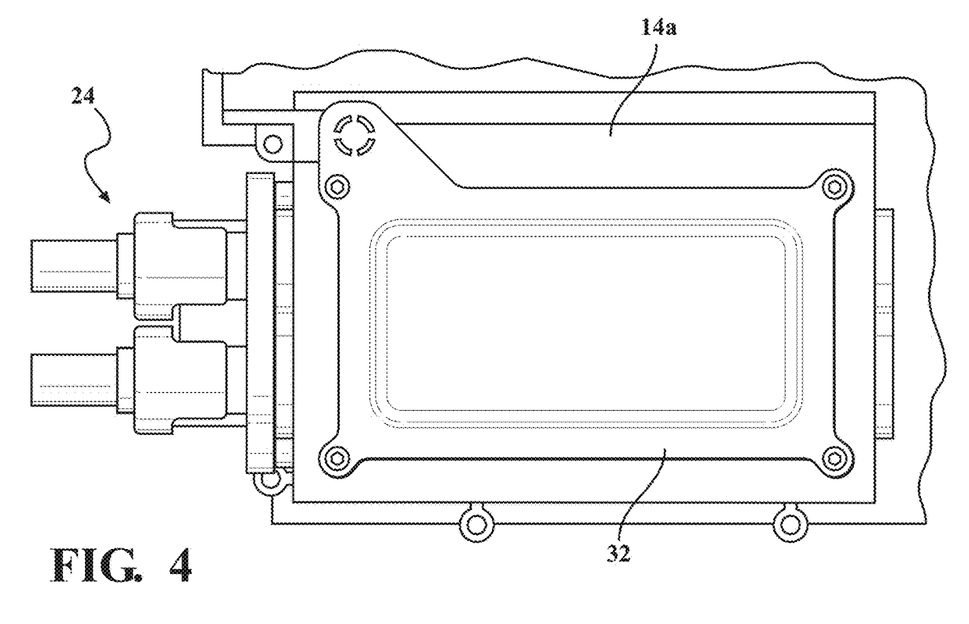
FIG. 4 is a first top view during the disassembly process of part of a high voltage inverter having an access assembly, according to embodiments of the present invention.

Referring now to FIGS. 4-7, the inverter 10 is shown during various steps of disassembly to allow access to the busbars 20,22 and the terminals 28a,28b. Referring to FIG. 4, the inverter 10 is shown having both the access cover 32 and the protected cover 34 assembled to the first housing portion 14a. If access to the area of the cavity 16 having the busbars 20,22 is needed, the first step is to remove the access cover 32. To remove the access cover 32, there are several fasteners (not shown) which are removed, allowing the access cover 32 to be detached from the first housing portion 14a. Once the access cover 32 is detached from the first housing portion 14a, the magnet tower 36 is no longer located in the recess 40.

Figure 5:
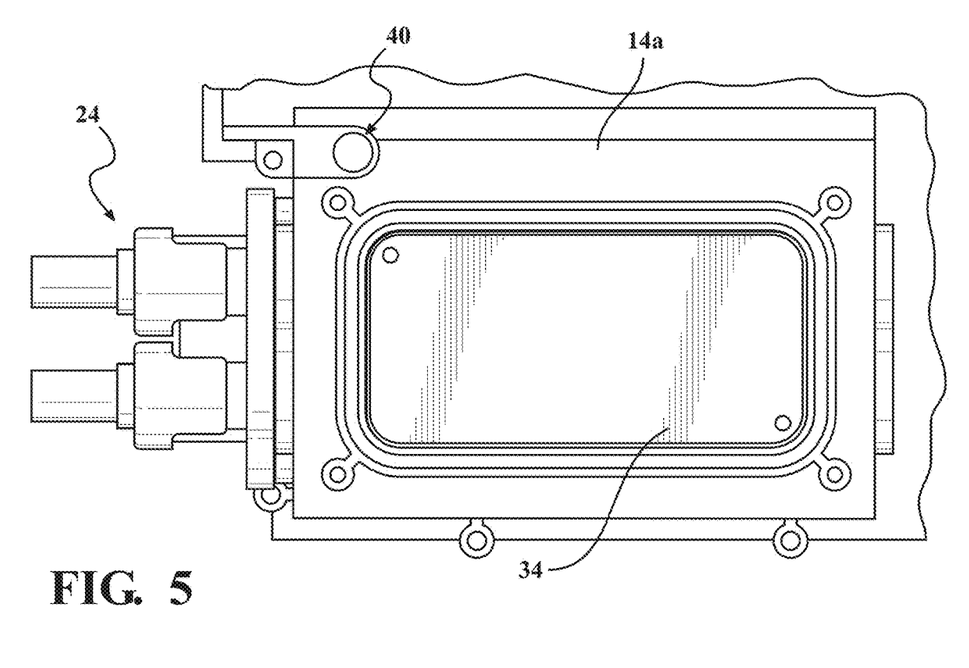
FIG. 5 is a second top view during the disassembly process of part of a high voltage inverter having an access assembly, according to embodiments of the present invention.

Referring to FIG. 5, the inverter 10 is shown with the access cover 32 removed. Once the access cover 32 is removed, the protective cover 34 may then be detached from the first housing portion 14a to allow access to the terminals 28a,28b. To remove the protective cover 34, there are several fasteners (not shown) which are removed, allowing the protective cover 34 to be detached from the first housing portion 14a. If the access cover 32 is detached from the first housing portion 14a, the presence of the magnet 38 is no longer detected by the sensor 42. The magnet 38 no longer being detected by the sensor 42 provides an indication such that that PCB 18 deactivates or discharges various components of the inverter 10. Therefore, once the presence of the magnet 38 is no longer detected by the sensor 42, the various components of the inverter 10 may be deactivated or discharged by the PCB 18.

Referring to FIG. 6, the inverter 10 is shown with the protective cover 34 removed. During the time needed to detach the protective cover 34 from the first housing portion 14a, the various components inside the inverter 10 become deactivated or discharged (as a result of the magnet 38 no longer being detected by the sensor 42 as described above), such that the terminals 28a,28b and busbars 20,22 may be accessed with minimal risk of injury. Removal of the access cover 32 and the protective cover 34 extends the time needed to access the cavity 16 (compared to the time needed to only remove one cover), allowing the various components inside the inverter 10 to become deactivated or discharged.

Referring to FIG. 7, the terminals 28a,28b and busbars 20,22 may be accessed to allow for removal of the DC connector 24. The DC connector 24 may be connected to the busbars 20a,22 using connection features 46a,46b (such as a self-locking fastener, or some any other suitable type of fastener, such as a self-clinching or weld fastener), and a corresponding screw (not shown) to connect the busbars 20,22 to the terminals 28a,28b.

An inverter having an alternate embodiment of an access assembly according to the present invention is shown in FIGS. 8-14, with like numbers referring to like elements.

Figure 10:
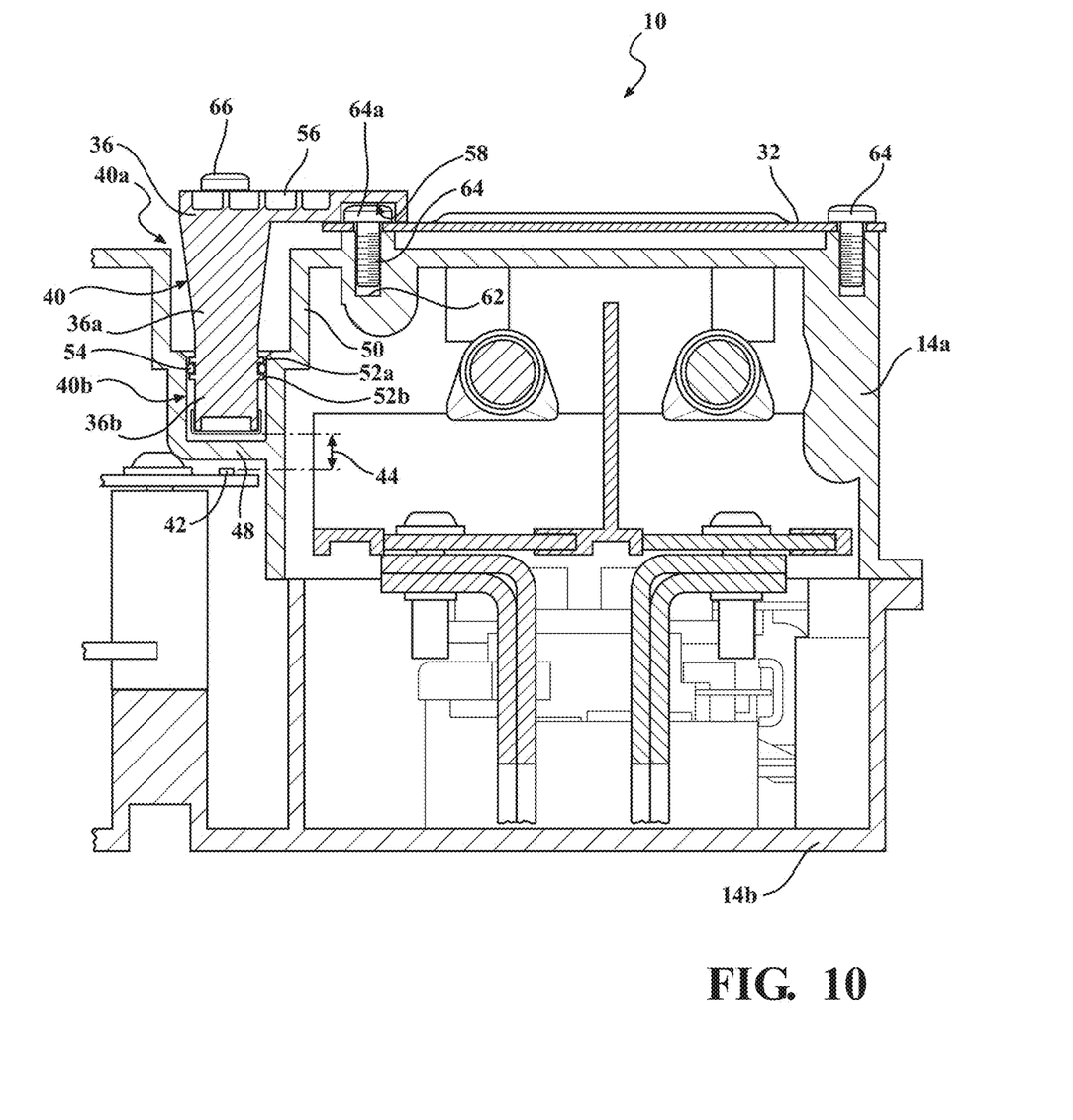
FIG. 10 is a sectional view taken along lines 10-10 of FIG. 8.

In this embodiment, there is no protective cover, only the access cover 32. The magnet tower 36 in this embodiment has a first portion 36a, which is generally conical-shaped, and a second portion 36b, which is generally cylindrical-shaped. Integrally formed with the magnet tower 36 are two circumferential flanges 52a,52b, and disposed between the circumferential flanges 52a,52b and circumscribing the second portion 36b of the magnet tower 36 is a seal, which in this embodiment is an O-ring 54. The recess 40 of the first cover portion 14a has two sections, a first section, shown generally at 40a which has a larger diameter than a second section, shown generally at 40b. When assembled, as shown in FIG. 10, the first portion 36a of the magnet tower 36 is located in the first section 40a, and the second portion 36b is generally located in the second section 40b. The O-ring 54 is in contact with the inner surface of the second section 40b such that the magnet 38 is prevented from being exposed to dirt, moisture, and various debris.

Figure 8:
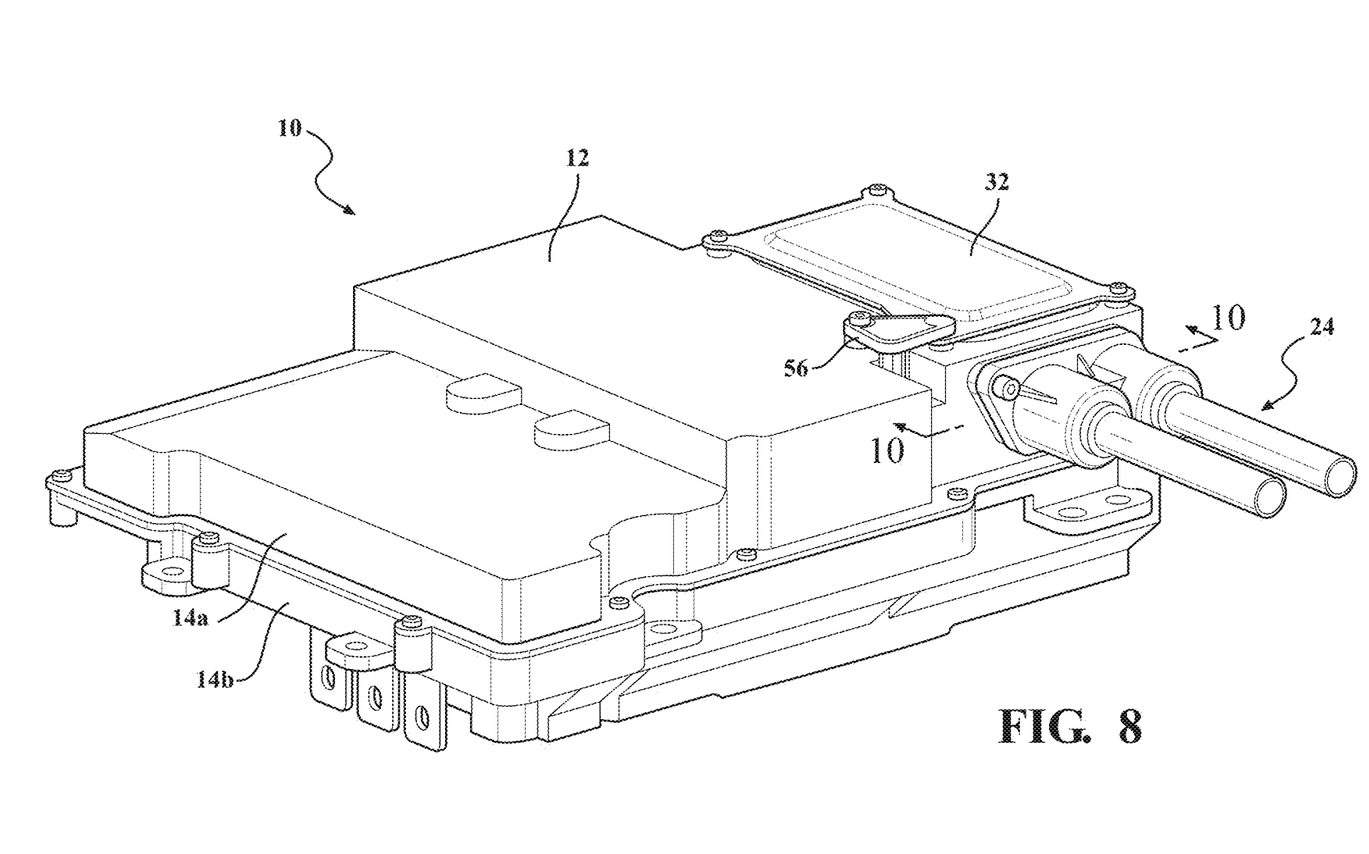
FIG. 8 is a perspective view of a high voltage inverter having an alternate embodiment of an access assembly, according to embodiments of the present invention.
Figure 9:
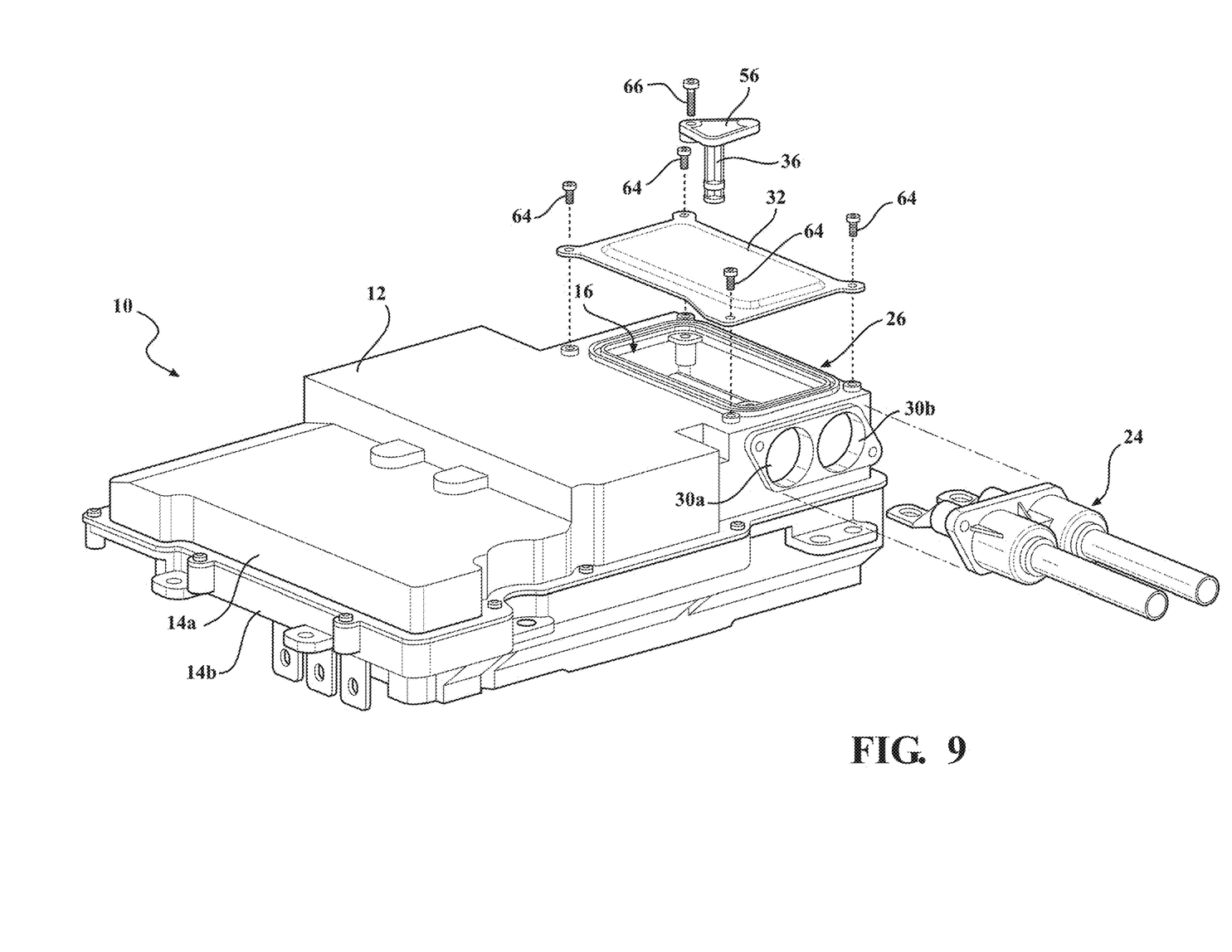
FIG. 9 is an exploded view of a high voltage inverter having an alternate embodiment of an access assembly, according to embodiments of the present invention.
Figure 11:
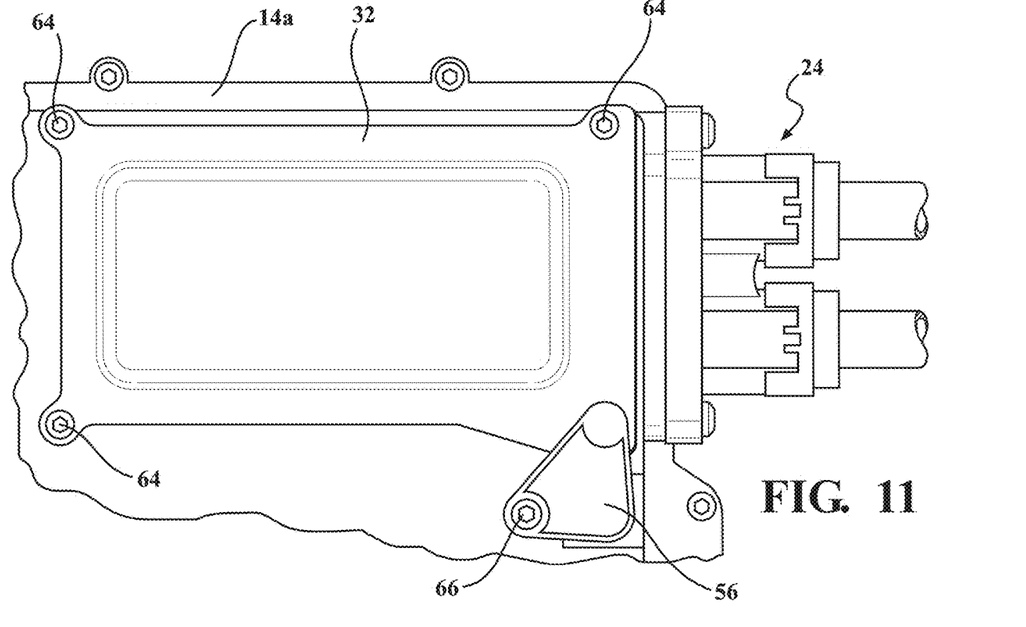
FIG. 11 is a first top view during the disassembly process of part of a high voltage inverter having an alternate embodiment of an access assembly, according to embodiments of the present invention.

Integrally formed with the magnet tower 36 is a connecting flange 56, and integrally formed with the connecting flange 56 is a recess portion, shown generally at 58. Also integrally formed with the connecting flange 56 is an aperture 60, and extending through the aperture 60 and into a corresponding threaded aperture 62 integrally formed as part of the first housing portion 14a is a fastener 66, which in the embodiment shown is a screw. It is shown in FIGS. 8 and 10-11 that the connecting flange 56 overlaps with the access cover 32. Therefore, the connecting flange 56 and magnet tower 36 must be removed before the access cover 32 may be removed. The access cover 32 is connected to the first housing portion 14a using several fasteners 64. In this embodiment, the fasteners 64 are screws, and one of the heads 64a of the screws 64 is disposed in the recess portion 58 of the connecting flange 56 when the access cover 32 and the connecting flange 56 are connected to the first housing portion 14a.

The access assembly in the embodiment shown in FIGS. 8-14 functions in a similar manner to the embodiment of the access assembly shown in FIGS. 1-7.

Referring now to FIGS. 11-14, the inverter 10 is shown during various steps of disassembly to allow access to the busbars 20,22 and the terminals 28a,28b. Referring to FIG. 11, the inverter 10 is shown having both the access cover 32 and connecting flange 56 assembled to the first housing portion 14a. If access to the area of the cavity 16 having the busbars 20,22 is needed, the first step is to detach the connecting flange 56 from the first housing portion 14a, which results in removal of the magnet tower 36 from the recess 40. To remove the connecting flange 56, the fastener 66 is removed, allowing the connecting flange 56, and therefore the magnet tower 36 to be detached from the first housing portion 14a.

Figure 12:
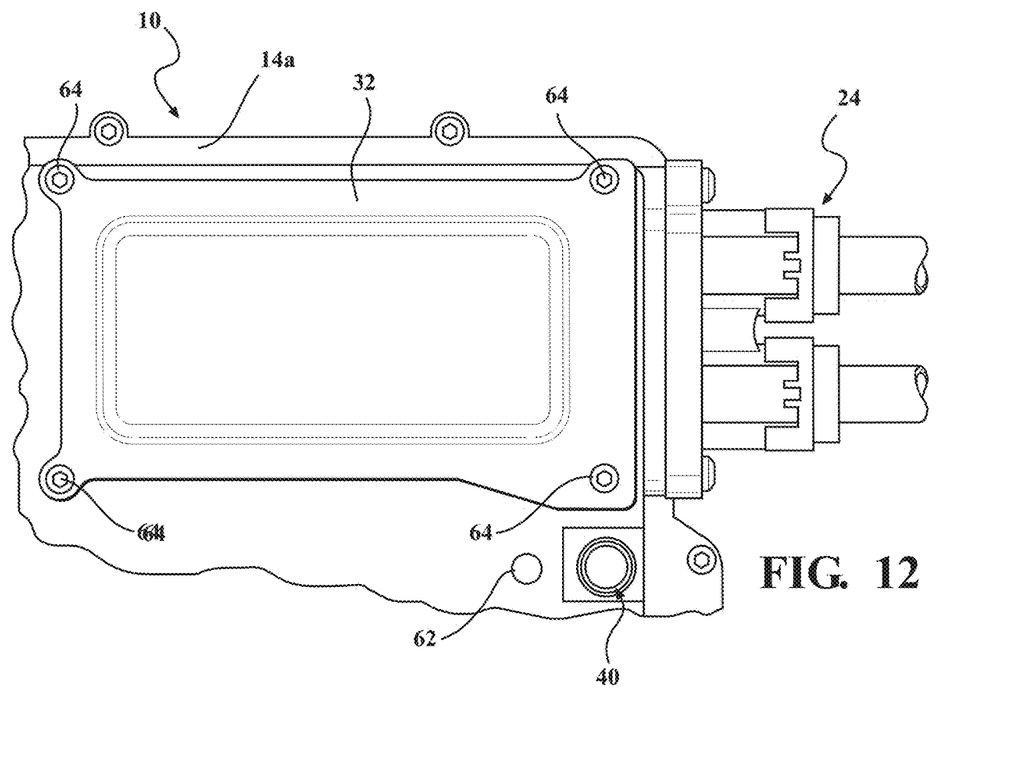
FIG. 12 is a second top view during the disassembly process of part of a high voltage inverter having an alternate embodiment of an access assembly, according to embodiments of the present invention.

Referring to FIG. 12, the inverter 10 is shown with the connecting flange 56 detached from the first housing portion 14a. Once the connecting flange 56 is removed, the access cover 32 may then be detached from the first housing portion 14a to allow access to the terminals 28a,28b. In a similar manner to the previous embodiment, to remove the access cover 32, the fasteners 64 are removed, allowing the access cover 32 to be detached from the first housing portion 14a. If the connecting flange 56 is removed, the presence of the magnet 38 is no longer detected by the sensor 42. The magnet 38 no longer being detected by the sensor 42 provides an indication such that the PCB 18 deactivates or discharges various components of the inverter 10. Therefore, once the presence of the magnet 38 is no longer detected by the sensor 42, the various components of the inverter 10 may be deactivated or discharged by the PCB 18.

Figure 13:
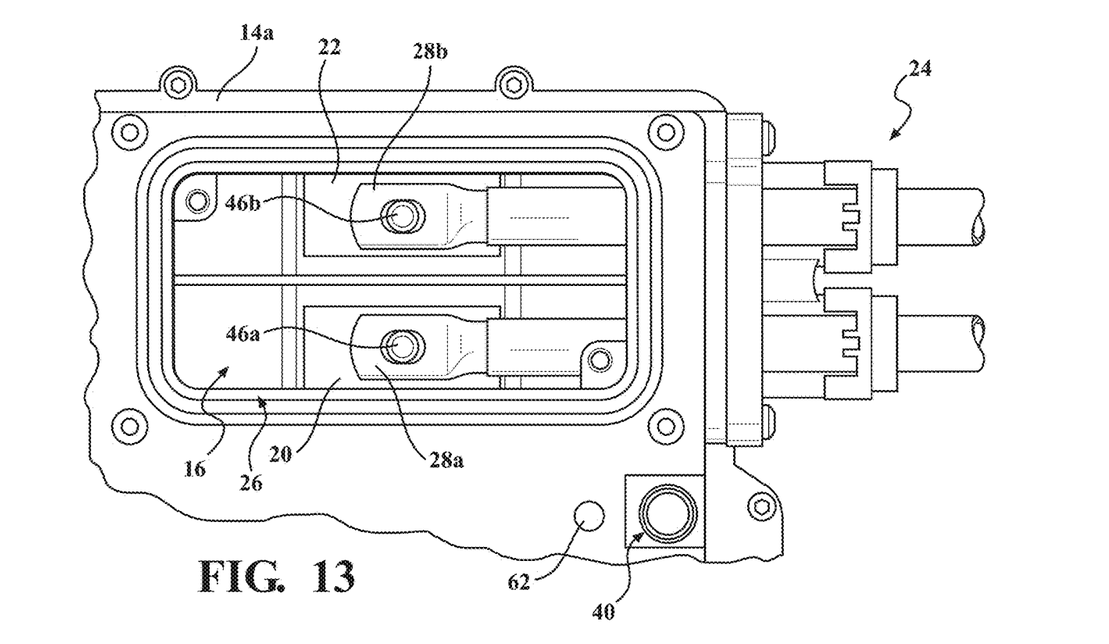
FIG. 13 is a third top view during the disassembly process of part of a high voltage inverter having an alternate embodiment of an access assembly, according to embodiments of the present invention.

Referring to FIG. 13, the inverter 10 is shown with the access cover 32 detached from the first housing portion 14a. During the time needed to detach the access cover 32 from the first housing portion 14a, the various components inside the inverter 10 become deactivated or discharged (as a result of the magnet 38 no longer being detected by the sensor 42 as described above), such that the terminals 28a,28b and busbars 20,22 may be accessed with minimal risk of injury. Removal of the access cover 32 and the connecting flange 56 extends the time needed to access the cavity 16 (compared to the time needed to only remove one cover), allowing the various components inside the inverter 10 to become deactivated or discharged.

Figure 14:
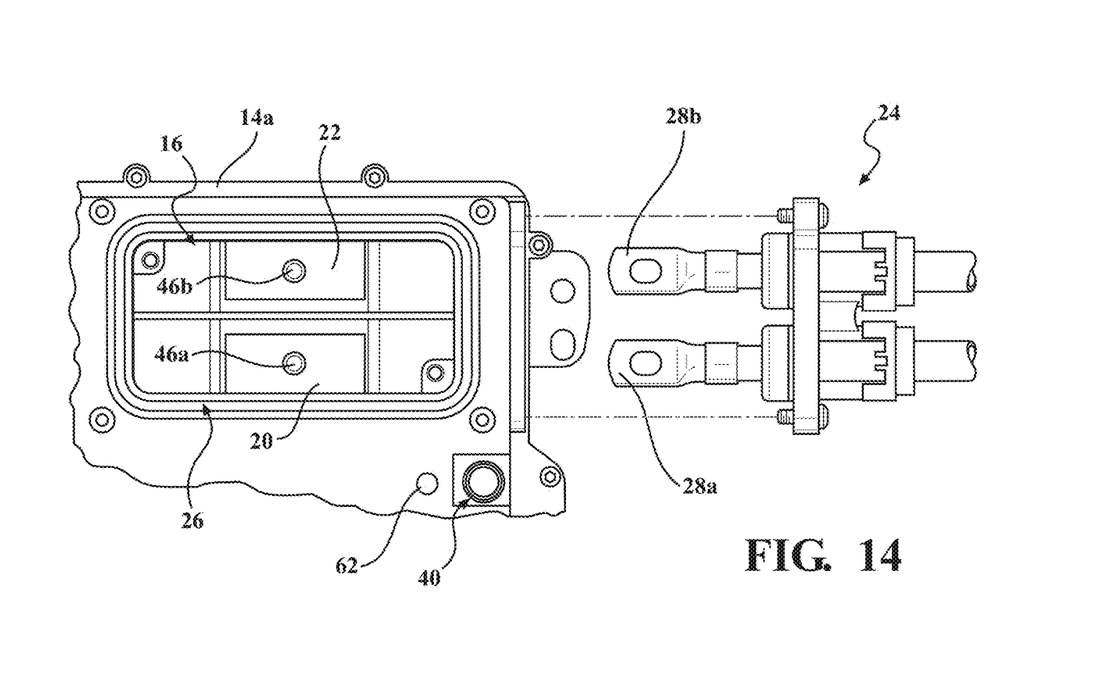
FIG. 14 is a fourth top view during the disassembly process of part of a high voltage inverter having an alternate embodiment of an access assembly, according to embodiments of the present invention.

Referring to FIG. 14, the terminals 28a,28b and busbars 20,22 may be accessed to allow for removal of the DC connector 24. As with the previous embodiment, the DC connector 24 may be connected to the busbars 20a,22 using the connection features 46a,46b and a corresponding screw (not shown), which connects the busbars 20,22 to the terminals 28a,28b.

The description of the invention is merely exemplary in nature and, thus, variations that do not depart from the gist of the invention are intended to be within the scope of the invention. Such variations are not to be regarded as a departure from the spirit and scope of the invention.

What is claimed is:

1. An apparatus, comprising:
   access assembly for an inverter, further comprising:
   a housing of an inverter;
   a recess integrally formed as part of the housing;
   an aperture integrally formed as part of the housing in proximity to the recess;
   an access cover which prevents access to the inside of the housing by blocking the aperture when the access cover is attached to the housing;
   a magnet tower selectively disposed in the recess, the magnet tower further comprising:
     a first portion being conically shaped;
     a second portion being cylindrically shaped, the second portion adjacent the first portion;
     at least two circumferential flanges integrally formed as part of the second portion of the magnet tower;
     a seal circumscribing the second portion of the magnet tower such that the seal is disposed between the at least two circumferential flanges;
   a magnet connected to the magnet tower;
   a sensor located inside the housing;
   a connecting flange integrally formed with the magnet tower, at least a portion of the connecting flange overlaps with the access cover when the access cover and the connecting flange are connected to the housing, and the seal is in contact with an inner surface of the recess when the access cover and the connecting flange are connected to the housing;
   wherein the magnet tower and magnet are located in the recess when the access cover is connected to the housing such that the sensor detects the presence of the magnet in the recess, and when the the access cover is removed from the housing such that the magnet tower and magnet are no longer located in the recess, the sensor detects when the magnet has been removed from the recess;
   wherein the connecting flange must be detached from the housing prior to the access cover being detached from the housing.

2. The apparatus of claim 1, further comprising:
   a printed circuit board (PCB) located inside the housing, the sensor mounted to the PCB;
   wherein the sensor detects the presence of the magnet in the recess when the access cover is attached to the housing, and the sensor detects when the magnet has been removed from the recess.

3. The apparatus of claim 1, further comprising:
   a lower wall integrally formed as part of the recess;
   wherein the lower wall is between the magnet tower and the sensor, such that the sensor detects the presence of the magnet tower through the lower wall.

4. The apparatus of claim 1 further comprising:
   an recess portion integrally formed as part of the connecting flange;
   at least one fastener extending through the access cover and into the housing, connecting the access cover to the housing, and a portion of the fastener extends into the recess portion;
   wherein the portion of the connecting flange which overlaps with the access cover also overlaps with the at least one fastener.

5. The apparatus of claim 1, the recess further comprising
   a first section; and
   a second section having a diameter that is smaller than the first section;
   wherein the first portion of the magnet tower is located in the first section of the recess and the second portion of the magnet tower is located in the section of the recess when the access cover and the connecting flange are connected to the housing such that the seal is in contact with an inner surface of the second section.

6. The apparatus of claim 1, further comprising
   a protective cover connected to the housing;
   wherein the magnet tower is connected to the access cover such that when the access cover is attached to the housing the magnet tower is disposed in the recess, and the protective cover is positioned such that the access cover must be detached from the housing prior to the protective cover being detached from the housing.

7. An access assembly for an inverter, further comprising:
   a housing of an inverter;
   a recess integrally formed as part of the housing;
   an aperture integrally formed as part of the housing in proximity to the recess;
   an access cover which prevents access to the inside of the housing by blocking the aperture when the access cover is attached to the housing;
   a magnet tower selectively disposed in the recess, the magnet tower further comprising:
     a first portion being conically shaped;
     a second portion being cylindrically shaped;
     at least two circumferential flanges integrally formed as part of the second portion of the magnet tower;
     a seal circumscribing the second portion of the magnet tower such that the seal is disposed between the at least two circumferential flanges;
   a magnet connected to the magnet tower;
   a sensor located inside the housing;
   a lower wall integrally formed as part of the recess, such that the magnet is detectable through the lower wall by the sensor when the magnet tower is disposed in the recess; and
   a printed circuit board (PCB) located inside the housing, the sensor mounted to the PCB;
   a connecting flange integrally formed with the magnet tower;
   a recess portion integrally formed as part of the connecting flange; and
   at least one fastener extending through the access cover and into the housing, connecting the access cover to the housing, and a portion of the fastener extends into the recess portion;
   wherein the magnet tower and magnet are located in the recess when the access cover is connected to the housing such that the sensor detects the presence of the magnet in the recess, and when the access cover is detached from the housing such that the magnet tower and magnet are no longer located in the recess, the sensor detects when the magnet has been removed from the recess;
   wherein at least a portion of the connecting flange overlaps with a portion of the access cover and also overlaps with the at least one fastener when the access cover and the connecting flange are connected to the housing, such that the connecting flange must be detached from the housing prior to the access cover being detached from the housing, and the seal is in contact with an inner surface of the recess when the access cover and the connecting flange are connected to the housing.

8. The access assembly for an inverter of claim 7, the recess further comprising:
- a first section; and
- a second section having a diameter that is smaller than the first section;
- wherein the first portion of the magnet tower is located in the first section of the recess and the second portion of the magnet tower is located in the section of the recess when the access cover and the connecting flange are connected to the housing such that the seal is in contact with an inner surface of the second section.

9. The access assembly for an inverter of claim 7, further comprising
- a protective cover connected to the housing;
- wherein the magnet tower is connected to the access cover such that when the access cover is attached to the housing the magnet tower is disposed in the recess, and the protective cover is positioned such that the access cover must be detached from the housing prior to the protective cover being detached from the housing.

\* \* \* \* \*